(12) United States Patent
Koomen et al.

(10) Patent No.: US 6,348,724 B1
(45) Date of Patent: Feb. 19, 2002

(54) SEMICONDUCTOR DEVICE WITH ESD PROTECTION

(75) Inventors: Joannes Joseph Maria Koomen; Wilhelmus Cornelis Maria Peters, both of Nijmegen (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/660,916

(22) Filed: Sep. 13, 2000

(30) Foreign Application Priority Data

Sep. 13, 1999 (EP) .............................. 99202978

(51) Int. Cl.[7] ...................... H01L 27/082; H01L 29/74; H01L 23/62
(52) U.S. Cl. .................. 257/577; 257/173; 257/355; 257/362; 257/567; 257/565; 257/592; 361/56
(58) Field of Search ..................... 361/54, 56; 257/173, 257/355, 362, 565, 567, 577, 592

(56) References Cited

U.S. PATENT DOCUMENTS 4,652,895 A   3/1987  Roskos ..................... 357/13
5,341,005 A   8/1994  Canclini .................... 257/173
5,850,095 A * 12/1998  Chen et al. ................. 257/361

FOREIGN PATENT DOCUMENTS

EP       0768713 A2     4/1997

* cited by examiner

Primary Examiner—Tom Thomas
Assistant Examiner—Ori Nadav
(74) Attorney, Agent, or Firm—Steven R. Biren

(57) ABSTRACT

The invention relates to a bipolar ESD protection comprising a protection transistor with a short-circuited base emitter (18, 19). Due to the snap-back effect, the transistor can switch from the normal high-ohmic condition to a low-ohmic condition in the case of ESD. To improve the protection performance, the protection structure is provided with a trigger element comprising a second transistor (26, 27, 28) with a lower breakdown voltage. The base (26) and the emitter (28) of the second transistor are connected to the base of the protection transistor. To increase the current carrying capability of the protection device, the trigger transistor is designed so as to be a vertical transistor.

7 Claims, 4 Drawing Sheets

SEMICONDUCTOR DEVICE WITH ESD PROTECTION

BACKGROUND OF THE INVENTION

The invention relates to a semiconductor device comprising a semiconductor body provided at a surface with a protection against damage caused by electrostatic discharge, which semiconductor body includes an island-shaped n-type surface region adjoining said surface, wherein a vertical npn-transistor is formed comprising an emitter, a base and a collector, which emitter is connected to a node to which, during operation, a reference voltage, for example ground, is applied, and the collector is connected to a bonding surface, and a diode having a breakdown voltage which is lower than that of the base-collector transition being arranged between the collector and the base.

Such a semiconductor device is disclosed, inter alia, in the patent document U.S. Pat. No. 5,341,005.

As the dimensions of integrated circuits decrease continuously and hence the circuit becomes more vulnerable to external influences, it becomes more important to design integrated circuits so as to be provided with an efficient protection against damage caused by electrostatic discharge (ESD), which is brought about, for example, by contact between a human body and an external contact pin connected to the circuit via a supply wire and a bonding pad present on the semiconductor body. The protection comprises an element which, under normal operating conditions is non-conducting or at least substantially non-conducting, so that it has no, or hardly any, effect on the operation of the circuit, and, when the voltage on the bonding pad exceeds a certain limit, this element becomes highly conducting enabling it to dissipate electric discharge current to, for example, ground.

The ESD protection described in the above-mentioned patent document U.S. Pat. No. 5,341,005 comprises a vertical bipolar npn-transistor whose collector is connected to the bonding pad and whose emitter is connected to ground. Between the collector and the, electrically floating, base of the transistor, a Zener diode is arranged to trigger the bipolar transistor. At a high voltage on the bonding pad, the Zener supplies current to the base, causing the transistor to become conducting and dissipate the electric charge to ground. In a special embodiment, an additional emitter is provided in the base, which emitter and the Zener jointly form a lateral npn-transistor. Said lateral transistor brings about a reduction of the breakdown voltage, while, in addition, the lateral transistor causes the on-resistance and the on-state voltages of the protection to be reduced. Since, however, in a lateral npn-transistor only a relatively small part of the pn-junction injects electrons into the base, the current carrying capability of this transistor is small and hence it contributes only relatively little to the current carrying capability of the protection. This is important because too high on-resistance and on-state voltages of the protection during ESD may cause the quality of the element to deteriorate. For this reason, the protection must be designed so as to be sufficiently large, and hence it takes up relatively much surface area of the circuit. An increase of the current carrying capability will therefore lead to a more robust element and/or to a protection having a smaller surface area. In addition, in the known ESD protection, a negative voltage on the bonding pad will cause the Zener to be forward biased and inject electrons which must be dissipated via the p-substrate, which may lead to latch up.

SUMMARY OF THE INVENTION

It is an object of the invention to provide, inter alia, an ESD protection which is compatible with standard IC processes and which has a large current carrying capability at a low on-state voltage, without an increase of the necessary surface area. The invention further aims at providing such an ESD protection wherein the risk that a negative voltage on the bonding pad will lead to latch up is much smaller than in the known device.

To achieve this, a semiconductor device of the type described in the opening paragraph is characterized in accordance with the invention in that the emitter is provided with an emitter contact which is also connected to the base, and in that, between the npn-transistor, hereinafter referred to as first transistor, and the diode, a second vertical npn-transistor is formed whose base is connected to the base of the first transistor, and whose emitter is conductively connected to the base of the second transistor. It is to be noted that the connection between the emitter zones and the associated base zones is to be taken to mean not only a short-circuit between the emitter and the base but also embodiments wherein the zones are interconnected via a resistor. As will be explained in greater detail by means of an example, in this construction, the second transistor, hereinafter also referred to as drive transistor, can send emitter current into the base of the first transistor, thereby contributing substantially to the current carrying capability of the protection. This also enables a reduction of the on-state voltage to be realized. Since the base is not electrically floating but connected to ground, possibly via a resistor, it is possible, in the case of a negative voltage on the bonding pad, to dissipate a large part of the electrons injected by the diode via the emitter and base connection instead of via the substrate, thereby substantially reducing the risk of latch-up.

A preferred embodiment of a device in accordance with the invention is characterized in that the emitter contact of the first transistor is connected to the base at a distance from the emitter. As a result of the distance between the emitter and base connections, a resistance is obtained which has a favorable effect on the operation of the transistor. In a modification, the base and the emitter of the first transistor are interconnected by a poly-resistor. A further preferred embodiment of a device in accordance with the invention, having a comparable advantage for the drive transistor, is characterized in that the emitter and the base of the second transistor are interconnected by means of a contact which is connected to the emitter and, at a distance from the emitter, to the base. In another embodiment, the emitter and the base of the second resistor are interconnected by a poly-resistor. A compact embodiment of a device in accordance with the invention is characterized in that the first and the second transistor have a common base zone and a common collector.

These and other aspects of the invention will be apparent from and elucidated with reference to the embodiments described hereinafter.

DESCRIPTION OF THE PREFERRED EMBODIMENTS

Figure 1:
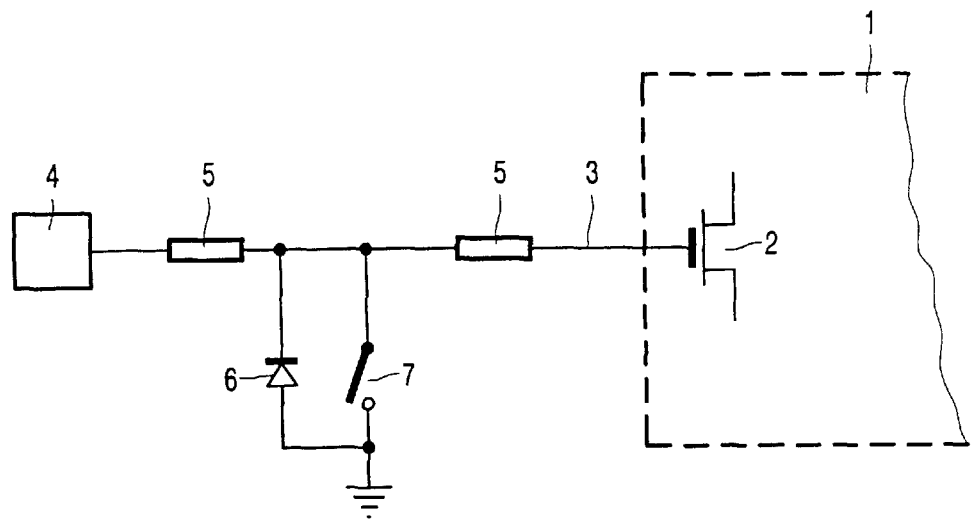
FIG. 1 diagrammatically shows the input of the semiconductor device in accordance with the invention.

In the diagram shown in FIG. 1, the area 1 indicated by means of broken lines represents an integrated circuit, an input of which, represented in the drawing by a MOS transistor 2 for the sake of simplicity, is connected to a bonding pad 4 via a metal track 3. The intrinsic resistance of the metal track 3 is indicated by the resistors 5. To protect the circuit against negative voltage pulses on the bonding pad 4, a diode 6 is provided between the bonding pad and a reference voltage, in this example ground, which is in the forward direction at a negative voltage and dissipates the charge towards ground. At a positive voltage on the bonding pad, the diode 6 is blocked. The circuit is protected against high positive voltages by the switch 7, which is open at a normal operating voltage on the bonding pad 4 and closed at a high voltage.

Figure 2:
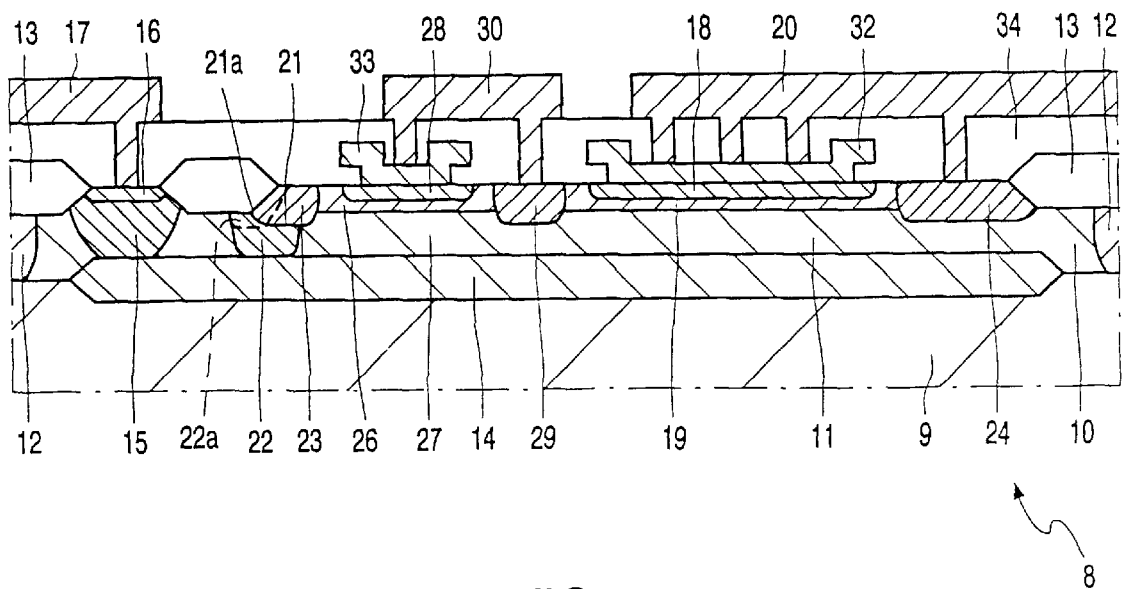
FIG. 2 is a cross-sectional view of an ESD protection in a semiconductor device in accordance with the invention.
Figure 3:
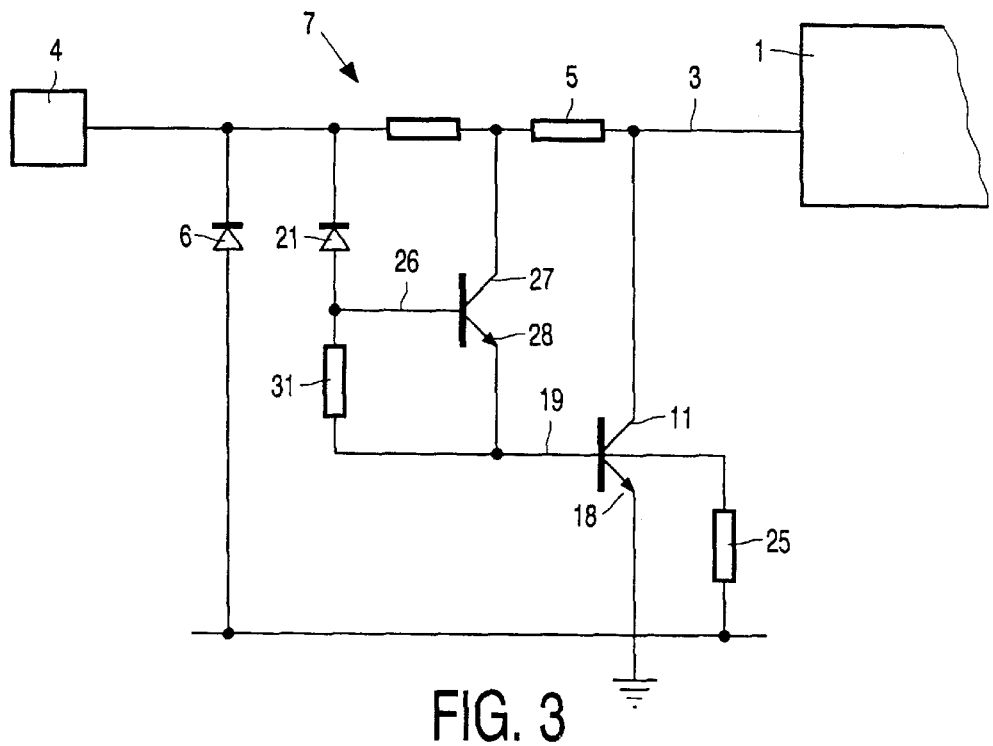
FIG. 3 shows an electric equivalent-circuit diagram of the ESD protection shown in FIG. 2.

FIG. 2 is a sectional view of a first embodiment of a semiconductor device in accordance with the invention. The equivalent circuit diagram of the protection is shown in FIG. 3. It is to be noted that only the ESD protection of the integrated circuit is shown in FIG. 2. As the other circuit elements are conventionally constructed, they are not shown in the drawing, but are regarded to be incorporated in the semiconductor body along with the ESD protection. The integrated circuit comprises a semiconductor body 8 of silicon including a p-type substrate 9 on which an n-type epitaxial layer 10 is provided. In the epi layer 10 an island 11 is defined which is laterally bounded in the epi layer by p-type zones 12 and a field-oxide pattern 13. If necessary, also a highly doped, buried p-type zone (not shown in the drawing) may be provided below the zone 12 at a distance from the buried n-type zone 14. A vertical bipolar npn-transistor is formed in the island 11 and comprises an n-type emitter 18, a p-type base 19 and an n-type collector which includes the island 11 and a highly doped n-type buried collector layer 14 provided at the interface between the epi layer and the substrate. Via a deep highly doped n-type zone 15 and a highly doped n-type contact zone 16, the collector is connected to a metal collector contact 17 which is connected via the metal track 3, not shown in FIG. 2, to the bonding pad 4. The emitter 18 is provided with an emitter contact 20 which is connected to ground. Between the base and the collector there is provided a diode 21 having a breakdown voltage which is lower than the breakdown voltage of the pn-junction between the collector 11 and the base 19, and which serves to trigger the protection in the case of a high voltage on the bonding pad. In the current example, the diode is formed by the pn-junction between a highly doped n-type sub-zone 22 of the collector and a highly doped p-type sub-zone 23 of the base. In a modification of this embodiment, an additional n-type channel stopper zone 22a is provided below the field oxide 13, which zone is indicated by means of broken lines in the drawing. Said additional n-doping enables a further reduction of the breakdown voltage of diode 21 to be obtained. The n-type zone 22 and the p-type zone 23 can be formed, for example, jointly with, respectively, n-type and p-type contact zones, resulting in a breakdown voltage which is (substantially) equal to 12 V.

In accordance with the invention, the emitter contact 20 is also connected to the base 19 at the location of a base-contact zone 24. The base contact is at some distance from the emitter 18, so that a base resistance 25 (FIG. 3) is incorporated which has a favorable effect on the protection. Between the transistor (11, 18, 19), hereinafter also referred to as first transistor, and the trigger diode 21, there is a second vertical npn-transistor which shares its base 26 and collector 27 with the base 19 and collector 11 of the first transistor, and the emitter of which, formed by the n-type zone 28, is conductively connected to the base 26. The connection between the emitter and the base comprises a p-type contact zone 29 and a metal contact 30. The contact zone 29 is not directly adjacent the emitter 28 but is situated at some distance from said emitter, so that also in this transistor a resistance is formed, referred to as resistance 31 in FIG. 3, between the emitter and the base.

The protection as described above is compatible with standard IC processes and can be manufactured using techniques which are known per se, which is the reason why it will not be further elucidated herein. It is noted only that the emitter zones 18 and 28 are diffused from or via polysilicon layers 32 and 33, respectively, which may be formed, for example, jointly with poly gates of field effect transistors. The metal contacts 17, 20, 30 are provided on an oxide layer 34 which is provided with base and collector contact windows above the monocrystalline silicon of the silicon body 8 and with emitter contact windows above the poly layers 32 and 33.

As the base 19 is connected to ground via the contact zone 24 and the contact 20 is connected to ground either directly or via a resistor, the pn-junction between the p-type base contact 24 and the p-type base and the n-type collector 11, 14 will be forward biased in the case of a negative voltage on the bonding pad, thus causing the vertical npn-transistor (11, 18, 19) to be brought into the reverse mode. In this case, dissipation of at least a large part of the electric charge on the bonding pad takes place, when the voltage on the bonding pad is negative, not only through diode 6 (FIG. 3) but also through this vertical npn-transistor.

Figure 4:
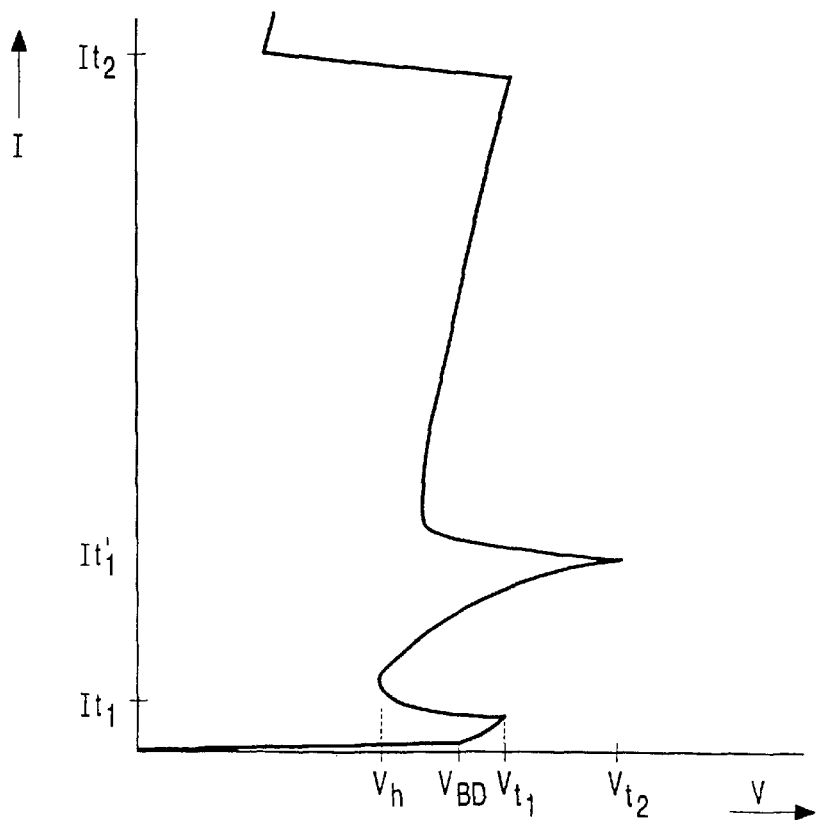
FIG. 4 shows a I-V characteristic of this ESD protection.

In FIG. 4, the current I is plotted versus the voltage V of the protection element 7. At a low voltage, no or hardly any current flows through the protection. At the breakdown voltage $V_{BD}$ of the pn-junction 21, for example 10 V, a current flow is initiated. The breakdown causes also holes to be supplied to the base of the first transistor (18, 19, 11) and to the base of the drive transistor (26, 27, 28). As a result of the snap-back effect, whereby breakdown at the base-collector junction in the transistor (18, 19, 11) occurs, the resistance becomes negative as a result of which the voltage across the protection decreases and current flows through the protection. The value of the trigger voltage $V_{d1}$ is, for example, 12 V. The voltage subsequently decreases to a value $V_h$ (holding voltage), for example 7 V, after which the protection enters a region where an increase of the voltage causes the current to increase fairly substantially. At the voltage $V^1_{t1}$ of, for example, 16 V, snap-back occurs in the drive transistor (26, 27, 28) as a result of which also this transistor becomes conducting and the voltage decreases again.

Thus, in the protection in accordance with the invention, the snap-back effect occurs twice. This is of particular importance because it also causes the dissipation in the protection to decrease, which manifests itself in a higher value of the current $I_{t2}$ upon second breakdown, whereby the protection can be irreparably damaged. An additional advantage is that the current in the base 19 of the transistor (18, 19, 11) is much more homogeneous than it would be in the absence of the drive transistor (26, 27, 28). Also this effect leads to a higher value of $I_{t2}$.

In the example described herein, the protection circuit comprises two transistors connected as a diode and a trigger diode. By varying the ratios between, for example, the resistors 25, 31 and 5, the order of directing the transistors (11, 18, 19) and (26, 27, 28) can be influenced, and the operation of the protection can be further optimized.

Figure 5:
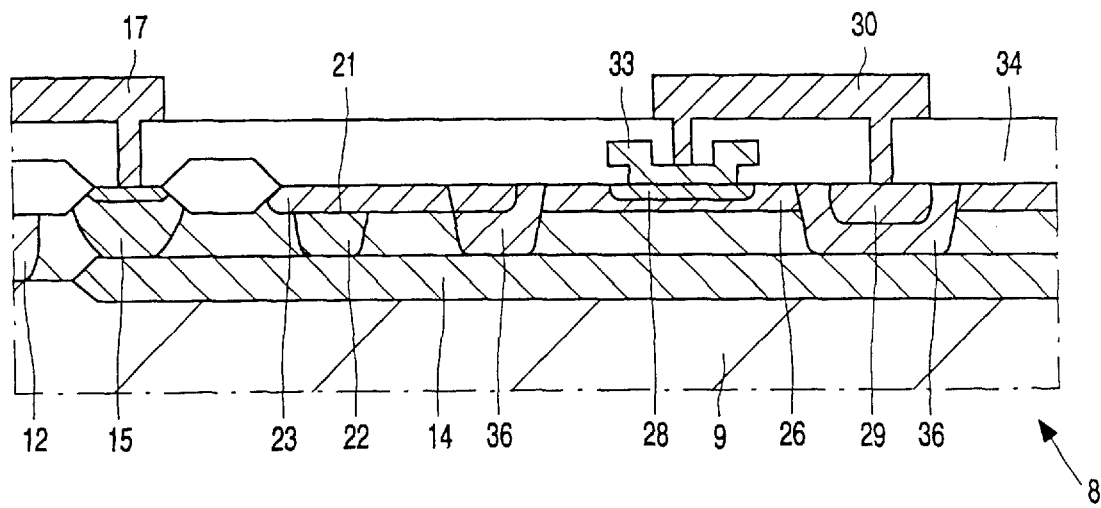
FIG. 5 is a sectional view of a modification of an ESD protection shown in FIG. 2.

FIG. 5 shows a modification of the embodiment shown in FIG. 2. FIG. 5 only shows the trigger diode 21 and the drive transistor (26, 27, 28). The rest of the protection, including the transistor (18, 19, 11), is the same as in the embodiment shown in FIG. 2, which is the reason why it is not shown again in FIG. 5. A first difference with respect to the embodiment shown in FIG. 2 is the absence of p-type wells 36 which extend from the surface as far as the buried collector layer 14 on either side of the drive transistor and preclude parasitic action by the vertical npn-transistor (26, 27, 28). In addition, the trigger diode 21 is situated at a distance from the drive transistor and separated therefrom by a deep p-well 36. Of course, such a deep p-well can also be provided around the base-contact zone 24 (see FIG. 2) of the transistor (18, 19, 11). Such a zone ends below the field oxide 13 and has the additional advantage that breakdown and edge and corner effects of the base contact are precluded. In the case of a BICMOS process, the zones 36 can be provided jointly with the p-type wells of the n-channel MOS transistors.

Figure 6:
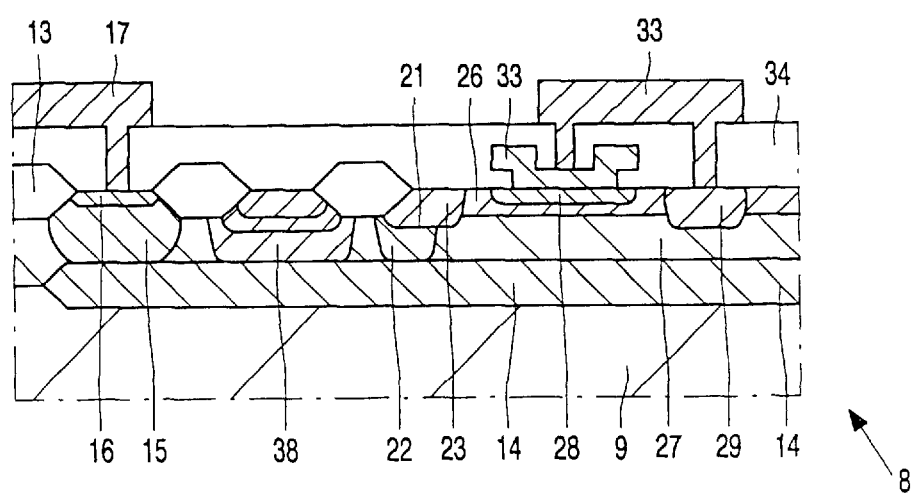
FIG. 6 is a sectional view of a second modification of the device shown in FIG. 2.

FIG. 6 is a sectional view of a second modification of the device shown in FIG. 2. It is noted that FIG. 6 only shows the part comprising the input contact 15, 16, 17 and the trigger transistor 26, 27, 28. The rest of the protection and transistor 18, 19, 11 is the same as in the embodiment shown in FIG. 2, which is the reason why it is not shown again in FIG. 6. The device shown in FIG. 6 differs mainly from the first example in that a p-type zone 38 is present which extends from the surface as far as the n-type buried zone 14 and is provided between the trigger diode/transistor and the input 15, 16, 17. As a well, the deep p-zone 38 can be formed simultaneously with the p-well implantation diffusion in the CMOS part of the circuit. As shown in the drawing, further p-type zones having a high doping may be formed, if necessary, in the zone 38, for example jointly with the base diffusions. By providing this p-type zone, which may be electrically floating, between the input 17 and the protection structure itself, it is achieved that the ESD current flows at a distance from the surface via a current path situated deeper within the semiconductor body, so that surface effects are at least substantially precluded. In addition, the zone 38 will advantageously bring about a reduction of current concentration at the edges of zones, resulting in an increase of the quality of the protection structure.

Figure 7:
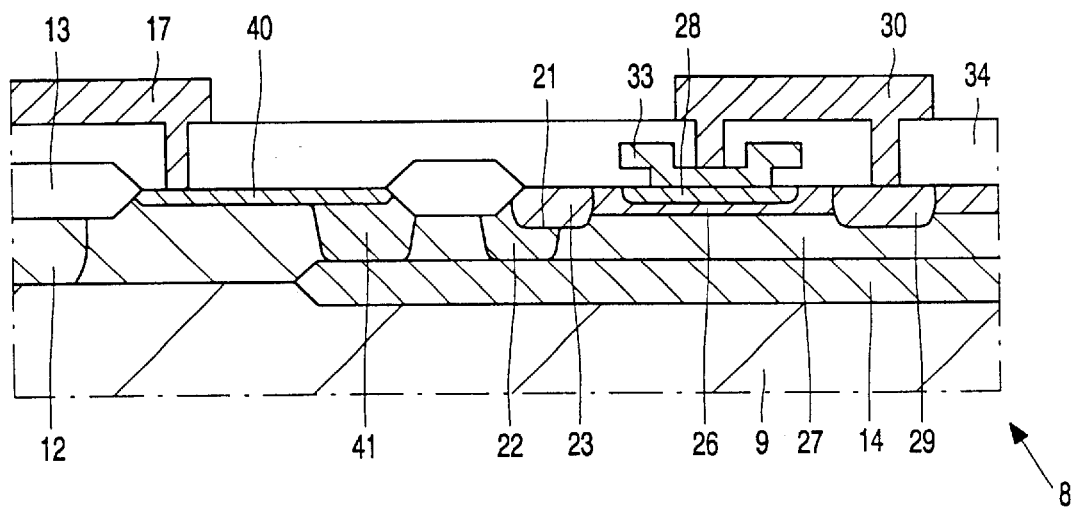
FIG. 7 is a sectional view of a third modification of the device shown in FIG. 2.

A further modification of the protection structure as shown in FIG. 2 is shown in section in FIG. 7. In this drawing only the input and the trigger diode transistor of the protection are shown. Unlike previous examples, the input contact 17 is arranged at a distance from the protection and separated therefrom by an n-type surface zone 40 which is connected to the buried zone 14 via a deep n-type zone 41. Said zone 40 forms a series resistance between the contact 17 and the protection. By virtue of this input configuration, the robustness of the protection is advantageously increased in that the "current crowding" phenomenon is suppressed along with the problem of local breakdown in the protection.

Figure 8:
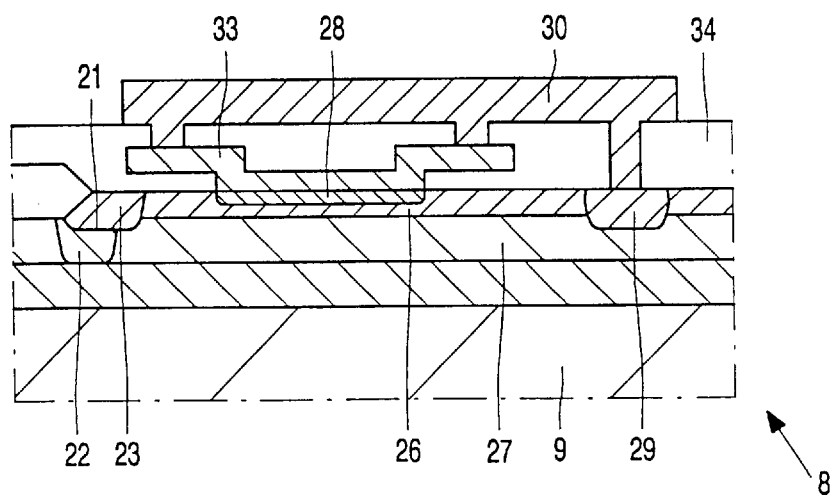
FIG. 8 is a sectional view of a fourth modification of the device shown in FIG. 2.

FIG. 8 is a sectional view of another embodiment wherein "current crowding" is at least substantially suppressed. The drawing mainly shows the transistor 26, 27, 28 and the trigger diode 21. In order to obtain a resistance, in this embodiment, the connection between the metal contact 30 and the poly layer 33 is not formed above the emitter 28, as is the case in the preceding examples, but outside the emitter diffusion, enabling the poly resistance of the layer 33 to be effectively used. Of course, such a resistance can also be realized in the transistor 18, 19, 11 which is not shown in FIG. 8.

It will be obvious that the invention is not limited to the examples given herein, and that, within the scope of the invention, many variations are possible to those skilled in the art. For example, the conductivity types can be reversed. Instead of poly contacts 32, 33, use can be made of metal contacts for the emitters.

What is claimed is:

1. A semiconductor device comprising a semiconductor body provided at a surface with a protection against damage caused by electrostatic discharge, which semiconductor body includes an island-shaped n-type surface region adjoining said surface, wherein a vertical npn-transistor is formed comprising an emitter, a base and a collector, which emitter is connected to a node to which, during operation, a reference voltage, for example ground, is applied, and the collector is connected to a bonding surface, and a diode having a breakdown voltage which is lower than that of the base-collector transition being arranged between the collector and the base, characterized in that the emitter is provided with an emitter contact which is also connected to the base, and in that, between the npn-transistor, hereinafter referred to as first transistor, and the diode, a second vertical npn-transistor is formed whose base is connected to the base of the first transistor, and whose emitter is conductively connected to the base of the second transistor.

2. A semiconductor device as claimed in claim 1, characterized in that the emitter contact of the first transistor is connected to the base at a distance from the emitter.

3. A semiconductor device as claimed in claim 2, characterized in that the emitter and the base of the second transistor are interconnected by means of a contact which is connected to the emitter and, at a distance from the emitter, to the base.

4. A semiconductor device as claimed claim 1, characterized in that the first and the second transistor have a common base zone and a common collector.

5. A semiconductor device as claimed in claim 4, characterized in that the base and the collector form a pn-junction comprising a part pertaining to the second transistor, which part constitutes said diode having a low breakdown voltage, the doping concentration of which is increased on the collector side with respect to adjoining parts of the transition.

6. A semiconductor device as claimed in claim 5, characterized in that the island-shaped surface region is formed by an island formed in an n-type epitaxial layer, which island is provided on a semiconducting substrate of the p-type, a highly doped, buried n-type collector layer being provided at the interface between the island and the substrate.

7. A semiconductor device as claimed in claim 6, characterized in that at least two highly doped n-type zones are provided in the island, which zones extend from the surface as far as, or at least substantially as far as, the buried collector layer, one of these zones forming a collector-contact zone and the other zone being provided along the edge of the base and forming part, jointly with the base, of said diode.

* * * * *